(12) United States Patent
Kirlin et al.

(10) Patent No.: US 6,320,213 B1
(45) Date of Patent: Nov. 20, 2001

(54) DIFFUSION BARRIERS BETWEEN NOBLE METAL ELECTRODES AND METALLIZATION LAYERS, AND INTEGRATED CIRCUIT AND SEMICONDUCTOR DEVICES COMPRISING SAME

(75) Inventors: Peter S. Kirlin, Bethel, CT (US); Scott R. Summerfelt, Garland, TX (US); Paul McIntryre, San Jose, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 08/994,089

(22) Filed: Dec. 19, 1997

(51) Int. Cl.$^7$ ............... H01L 29/76; H01L 29/94; H01L 31/062; H01L 31/113
(52) U.S. Cl. ............................. 257/295; 257/303
(58) Field of Search .................. 257/295, 296, 257/763, 753, 764, 303, 306

(56) References Cited

U.S. PATENT DOCUMENTS

| | | | |
|---|---|---|---|
| 5,358,901 | * 10/1994 | Fiordalice et al. | 437/192 |
| 5,475,248 | * 12/1995 | Takenaka | 257/295 |

(List continued on next page.)

FOREIGN PATENT DOCUMENTS

| | | |
|---|---|---|
| 0697720A1 | 2/1996 | (EP) . |
| 0698918A1 | 2/1996 | (EP) . |

OTHER PUBLICATIONS

Taylor, D.J., et al., "Electrical Properties of $SrBi_2Ta_2O_9$ Thin Films and Their Temperature Dependence for Ferroelectric Nonvolatile Memory Applications", Appl. Phys. Lett. 68(16), Apr. 15, 1996, pp. 2300–2302.

Dormans, G.J.M., et al., "Processing and Performance of Integrated Ferroelectric and CMOS Test Structures for Memory Applications", Integrated Ferroelectrics, vol. 6, 1995, pp. 93–109.

Kotecki, D.E., "High–K Dielectric Materials for DRAM Capacitors", Semiconductor International, Nov. 1996, pp. 109–116.

Zurcher, P., et al., "Ferroelectric Nonvolatile Memory Technology: Applications and Integration Challenges", 1996 International Nonvolatile Memory Technology Conference, pp. 133–139.

*Primary Examiner*—Olik Chaudhuri
*Assistant Examiner*—Phat X. Cao
(74) *Attorney, Agent, or Firm*—Marianna Fuierer; Steven J. Hultquist; Robert A. McLauchlan

(57) ABSTRACT

A dynamic random access memory device (100) includes storage capacitors using a high dielectric constant material, such as, $BaSrTiO_3$, $SrBi_2Ta_2O_9$ and $PbZrTiO_3$, for the capacitors' insulator. The device includes a conductive plug (106) formed over and connecting with a semiconductor substrate (102). A buffer layer (107) of titanium silicide lays over the plug, and this layer serves to trap "dangling" bonds and to passivate the underlying surface. A first diffusion barrier layer (108), e.g., titanium aluminum nitride, covers the titanium silicide. A capacitor first electrode (110) lays over the diffusion barrier layer. The high dielectric constant material (112) is laid over the capacitor first electrode. A capacitor second electrode (116) is laid over the high dielectric constant material. A second diffusion barrier layer (120) is deposited on the capacitor second electrode. A conductor, such as aluminum (130), is laid over the second diffusion barrier layer. An isolation dielectric (132) can be deposited over the conductor at a high temperature without causing oxygen or metallic diffusion through the first and second diffusion barrier layers.

13 Claims, 11 Drawing Sheets

U.S. PATENT DOCUMENTS

| | | | |
|---|---|---|---|
| 5,481,490 | * | 1/1996 | Watanabe et al. .................... 365/145 |
| 5,504,041 | | 4/1996 | Summerfelt . |
| 5,576,928 | * | 11/1996 | Summerfelt et al. ............. 361/321.1 |
| 5,578,839 | | 11/1996 | Nakamura et al. . |
| 5,585,300 | | 12/1996 | Summerfelt . |
| 5,612,574 | * | 3/1997 | Summerfelt et al. ................ 257/783 |
| 5,825,609 | * | 10/1998 | Andricacos et al. .................. 257/295 |
| 5,837,591 | * | 11/1998 | Shimada et al. ..................... 438/381 |
| 5,892,254 | * | 4/1999 | Park et al. ............................ 257/295 |
| 5,903,053 | * | 5/1999 | Iijima et al. ......................... 257/751 |
| 5,930,639 | * | 7/1999 | Schuele et al. ...................... 438/396 |

* cited by examiner

DIFFUSION BARRIERS BETWEEN NOBLE METAL ELECTRODES AND METALLIZATION LAYERS, AND INTEGRATED CIRCUIT AND SEMICONDUCTOR DEVICES COMPRISING SAME

FIELD OF THE INVENTION

This invention relates to integrated circuits and more particularly to barriers to diffusion of materials during processing.

BACKGROUND OF THE INVENTION

Integrated circuit memory devices, such as dynamic random access memories (DRAMs), include in each storage cell a transfer transistor and a capacitor for temporarily storing information. These devices have been increasing in the number of storage cells per device for many years. Each increase of storage capacity is made possible by shrinking the amount of space, i.e., the device surface area, occupied by each storage cell. Necessary shrinkage has been accomplished by shrinking storage cell components such as the transistor and the capacitor.

The capacitance of the capacitor is particularly important because the capacitor's ability to accurately store and read out bits of data is closely related to the quantity of charge stored in the capacitor. In the past, the capacitance has been kept high by forming three dimensional capacitors known, for example, as trench capacitors and stacked capacitors. More recently, designers have pursued forming capacitors having an insulator material with a high dielectric constant. Such materials have a dielectric constant much higher than the dielectric constant of familiar materials, such as, silicon dioxide ($SiO_2$), silicon nitride ($Si_3N_4$), and combinations thereof.

It is known that high dielectric constant materials, such as $BaSrTiO_3$, $SrBi_2Ta_2O_9$ and $Pb(ZrTi)O_3$, generally are not chemically stable when they are deposited directly on a semiconductor substrate. One or more additional layers of other materials are used to make an electrical connection between the high dielectric constant material and the substrate. For example, the storage node, or storage plate, is a bottom capacitor electrode made of conductive material, such as platinum (Pt), palladium (Pd), gold (Au), or other conductive material, that lies under the capacitor dielectric. The storage node is connected by way of a conductive contact, such as Al, an Al alloy, polysilicon, or doped silicon, to the source/drain electrode of the transfer transistor formed in the semiconductor substrate.

The additional layers of materials include a barrier layer, or layers, interposed between the high dielectric constant material and the substrate to prevent the diffusion of oxygen from the furnace atmosphere into the conductive contact when the high dielectric material is being deposited at temperatures of 500° C. and greater. In accordance with the prior art, once the high dielectric material is deposited, the problem of oxygen diffusion into the conductive contact is solved because subsequent processing steps use lower temperatures and/or a non-oxidation furnace atmosphere. See for example, U.S. Pat. No. 5,504,041, which is incorporated herein by reference thereto.

Although the aforementioned problem has been resolved by the use of the barrier layers between the high dielectric constant material and the substrate, other problems continue to exist in the fabrication of integrated circuit devices which include high dielectric constant materials.

For instance noble metals, such as platinum, palladium, titanium and gold, are considered to be useful as the top, or plate, electrode of the capacitors using high dielectric constant materials like $BaSrTiO_3$, $SrBi_2Ta_2O_9$ and $Pb(ZrTi)O_3$. Those top electrodes are to be interconnected with a metallization layer made of aluminum or an aluminum alloy. Adverse interactions occur between the metallization layer and the high dielectric constant material during device processing steps including and following the deposit of the metallization layer. A barrier layer of titanium nitride (TiN) has been used between a platinum electrode and an aluminum metallization over $SrBi_2Ta_2O_9$ (SBT). A barrier layer of titanium tungsten (TiW) has been used between a platinum or titanium electrode and an aluminum metallization over $Pb(ZrTi)O_3$ (PZT). A titanium nitride barrier layer is however unsuitable when an oxidizing annealing step is used in the fabrication sequence after etching the top electrode and barrier structure, since such oxidizing annealing step will cause oxidation and degradation of the titanium nitride barrier layer.

SUMMARY OF THE INVENTION

The aforementioned problem is resolved by an integrated circuit device having a capacitor with a high dielectric constant material. A top electrode of the capacitor is fabricated in a metal. A diffusion barrier layer, e.g., titanium aluminum nitride, is laid over the top electrode. A metallization layer connects to the diffusion barrier layer. The metallization layer includes a material, such as, aluminum, an aluminum-based metal, tungsten, or a tungsten-based metal.

The diffusion barrier layer of titanium aluminum nitride is very stable against diffusing oxygen. Additionally that layer does not react with the platinum at temperatures of 500° C. and higher, which may occur in subsequent processing steps of the integrated circuit device.

Other materials which may be used as the diffusion barrier include amorphous alloys, exotic nitrides, metal silicides, and conductive noble-metal-insulator-alloys.

Advantageously, other layers of materials, such as an interlevel dielectric and a passivation layer, can be deposited at high temperatures over the diffusion barrier layer and the metallization without adversely effecting the high dielectric constant material or the metallization layer.

BRIEF DESCRIPTION OF THE DRAWINGS

A fuller understanding of the invention may be derived by reading the following detailed description with reference to the drawings wherein.

DETAILED DESCRIPTION OF THE INVENTION, AND PREFERRED EMBODIMENTS THEREOF

Figure 1:
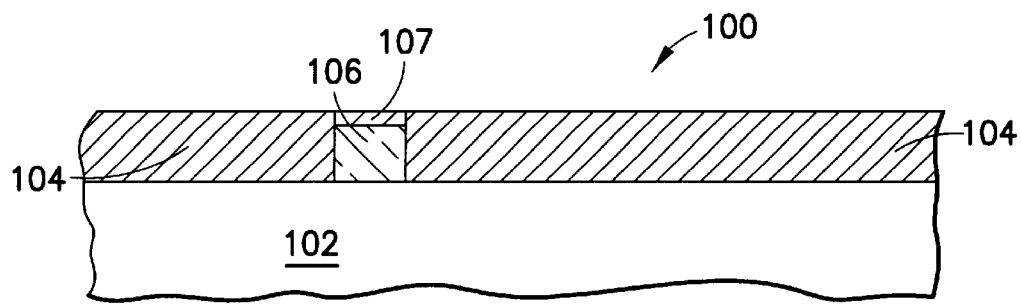
FIG. 1 is a cross-section of a semiconductor device having an insulator including a connection plug and a buffer layer laid on a semiconductor substrate.

Referring now to FIG. 1, there is shown the cross-section of an integrated circuit semiconductor device 100, which is in the process of fabrication. Device 100 includes a semiconductor substrate 102 that may include active devices, not shown, because they are well known. The semiconductor substrate 102 may be silicon, doped silicon, or another semiconductor material.

Front end processing on the device 100 is considered to be complete. The device 100 also includes a layer of insulator material 104, such as silicon dioxide ($SiO_2$). A contact plug 106 of conductive material, such as titanium nitride (TiN), titanium nitride oxycarbide ($TiN_xO_yC_z$ where x+y+z<2), polysilicon, doped silicon, aluminum (Al), aluminum alloys, tungsten (W), tungsten alloys, and silicides such as titanium silicide, nickel silicide and cobalt silicide, has been fabricated in an opening through the layer of insulator 104 to make contact with the semiconductor substrate 102. The opening through the insulator 104 typically can be fabricated by a patterned photoresist and etching step, as is well known. Contact plug material is deposited over the device and fills the opening. A subsequent overall etch of the plug material removes the plug material from the top of the insulator material 104 and forms a shallow depression at the top of the plug 106.

Thereafter a layer of buffer material 107, e.g., titanium silicide formed by the "SALICIDE" process, is deposited over the top surfaces of the insulator material 104 and the plug 106. The buffer material 107 is a material that matches the plug material 106 to an oxidation barrier material, to be deposited and described in greater detail subsequently herein. Additionally the buffer material 107 provides good adhesion to the plug material 106, the insulator material 104, and the oxidation barrier material. For this example, a suitable buffer material is titanium silicide.

Figure 2:
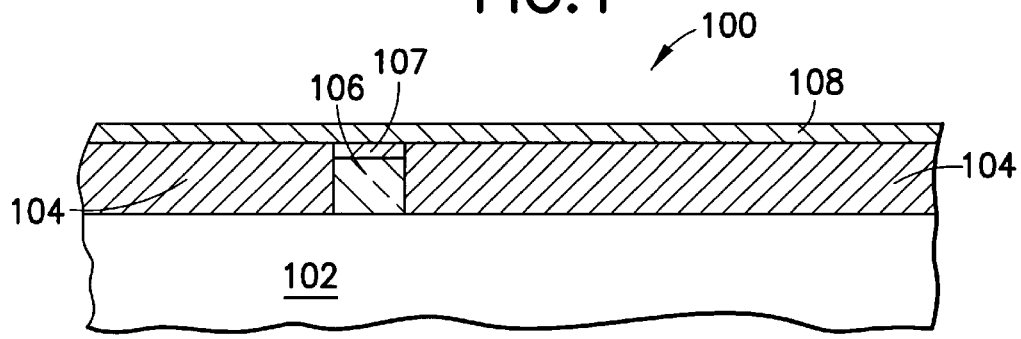
FIG. 2A is a cross-section of the semiconductor device of FIG. 1 having a diffusion barrier layer laid over the insulator and buffer layer covering the plug.
FIG. 2B is a cross-section of an alternative semiconductor device of the type shown in FIG. 1 having a conductive diffusion barrier layer patterned with the plug, and an insulating diffusion barrier layer overlying the insulator material.

FIG. 2A shows the result of the next step of the fabrication process. A layer of diffusion barrier material 108 is deposited over the top of the insulator 104 and the buffer layer 107 covering the plug 106. Titanium aluminum nitride (TiAlN) is an advantageous material for making the diffusion barrier 108. Approximately 100 nm of titanium aluminum nitride is deposited by reactive RF sputtering, using a titanium aluminide (TiAl) target in a $N_2$+Ar (5:95) ambient at 10 m Torr with the substrate held near 100° C.

Titanium aluminum nitride is selected for the diffusion barrier layer because it provides a barrier that substantially reduces diffusion of any oxygen. Additionally, the titanium aluminum nitride reduces diffusion of aluminum and platinum which are used as conductors in the device 100.

The titanium aluminum nitride is selected from a large group of materials which may be used as a diffusion barrier. Other exotic conductive nitrides include Zr—N, Hf—N, Y—N, Sc—N, La—N, other rare earth nitrides, N-deficient Al nitride, doped Al nitride, Mg—N, Ca—N, Sr—N, Ba—N, and alloys of the foregoing with Ti, Ga, Ni, Co, Ta, or W. Amorphous nitrides include Ti—Si—N, Ta—B—N, Ti—B—N, and Ta—Si—N. Noble-metal conductive alloys include Pd—Si—N, Pt—Si—N, Pt—Si—O, Pd—Si—O, Pd—B—O, Pd—B—N, Pd—Al—O, Pd—Al—N, Ru—Si—O, Ru—Si—N, Ir—Si—O, Ir—Si—N, Re—Si—

O, Re—Si—N, Rh—Al—O, Au—Si—N, and Ag—Si—N. All of the above can be deposited from metalorganic precursors, in accordance with well known practice. The diffusion barrier layer reduces or prevents diffusion of oxygen, aluminum, and platinum during high temperature (in excess of 500° C.) process step and process steps involving an oxidizing atmosphere. The diffusion barrier layer is conductive.

FIG. 2B shows an alternative next step of the fabrication process, which may be carried out in lieu of the fabrication process described in connection with FIG. 2A, but with subsequent steps being the same (as described in connection with FIGS. 3 et seq.). As shown in FIG. 2B, a conductive diffusion barrier layer 108 is patterned with the plug 106. The conductive diffusion barrier layer 108 may be formed of titanium aluminum nitride or other suitable diffusion barrier layer material of construction. Outside the plug region of the structure, an insulating diffusion barrier material 109, such as titanium dioxide, is deposited over insulator 104.

Figure 3:
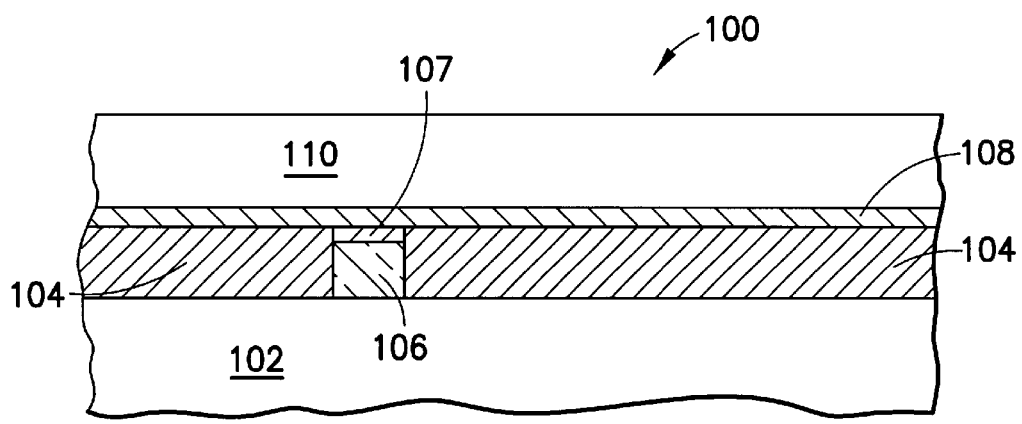
FIG. 3 is a cross-section of the device of FIG. 2A having a layer of conductive material deposited over the diffusion barrier layer as a bottom electrode of a capacitor.

Referring now to FIG. 3, a layer of conductive material 110 is formed on top of the diffusion barrier 108. Platinum (Pt) is a good conductive material for the layer 110. This layer 110 will be used subsequently as a storage node, or bottom electrode, of the cell capacitor. A 200 nm layer of platinum is DC sputtered in an atmosphere of argon (Ar) at 5 m Torr using a platinum target with the substrate at a temperature of 325° C. Alternatively, the conductive layer 110 can be deposited by e-beam evaporation, chemical vapor deposition (CVD), or metalorganic CVD (MOCVD). Better microstructure and thermal stress conditions can generally be obtained by depositing the layer 110 at a temperature in a range between 300° C. and 600° C.

For the layer 110, platinum is selected from a group of materials which are good conductors for integrated circuits. Other materials include polysilicon, doped silicon, aluminum, tungsten, and paladium. They can be deposited in accordance with well known practice.

Figure 4:
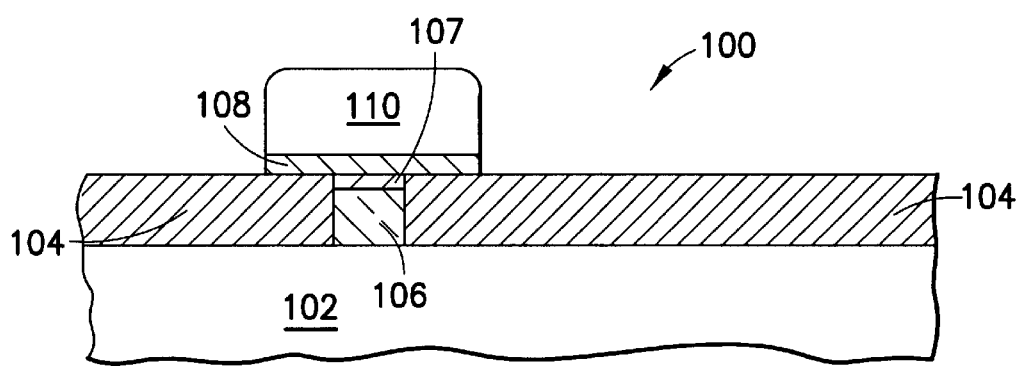
FIG. 4 shows a cross-section of the device of FIG. 3 following patterning and etching of the conductive and diffusion barrier layers.

FIG. 4 shows the result of the next step in the fabrication process. During this step the conductive layer 110 is covered with photoresist and is patterned into a desired capacitor storage node, or bottom electrode, shape. Then the conductive platinum layer 110 and the diffusion barrier layer 108 are dry etched in a low pressure, high density plasma reactive ion etch reactor. Patterning and etching are well established practices. The result is a platinum capacitor storage node formed on top of the diffusion barrier layer 108, which prevents the penetration of oxygen into the conductive plug 106 during subsequent processing steps. Thus the conductive plug 106 retains its good conductive quality during subsequent processing steps that occur with an oxygen atmosphere.

Figure 5:
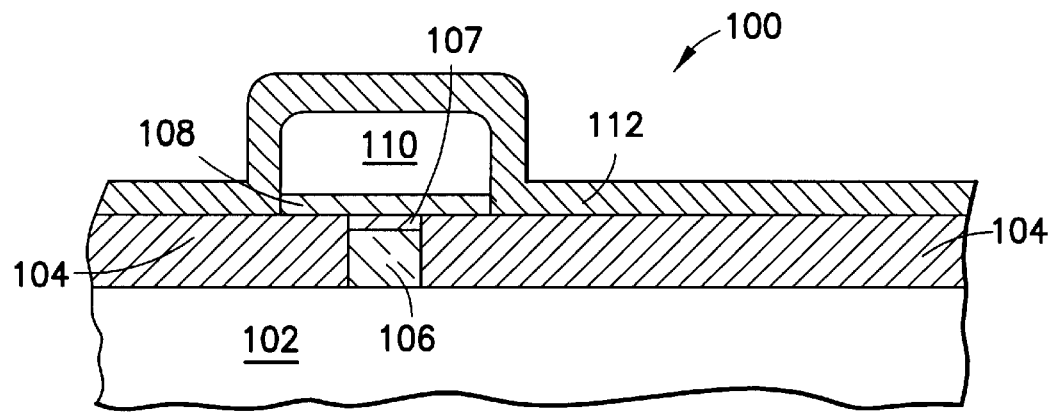
FIG. 5 is a cross-section of the device of FIG. 4 after a layer of high dielectric constant material is deposited over the top surfaces shown in FIG. 4.

Referring now to FIG. 5, the next step in the fabrication sequence deposits a layer of high dielectric constant material 112. The material 112 can be, for example, lead zirconium titanium oxide (Pb(ZrTi)$O_3$), strontium bismuth tantalum oxide (SrBi$Ta_2O_9$), or barium strontium titanium oxide ((BaSr)Ti$O_3$). Other materials are perovskites, pyroelectrics, ferroelectrics, highdielectric-constant-oxides, complex metal oxides, (Ba, Sr, Ca, Mg)(Ti, Zr)$0_3$, (Pb, La)(Zr, Ti)$O_3$, bismuth titanate, potassium tantalate, lead scandium tantalate, lead niobate, potassium niobate, lead zinc niobate, lead magnesium niobate, tantalum pentoxide, and yttrium oxide. The device structure first is annealed at a temperature of 600° C. for twenty minutes in 1 Torr of oxygen. Then the layer of high dielectric constant material 112 is deposited by metal-organic chemical vapor deposition (MOCVD) of the material at a temperature of 650° C. in 1 Torr of oxygen for three minutes. This processing step provides very oxidizing conditions, however, the platinum layer 110 remains unoxidized and the diffusion barrier layer 108 substantially prevents oxygen from diffusing through to the plug material 106 and the substrate 102. Platinum and aluminum only diffuse through the diffusion barrier layer 108 at very low rates.

Figure 6:
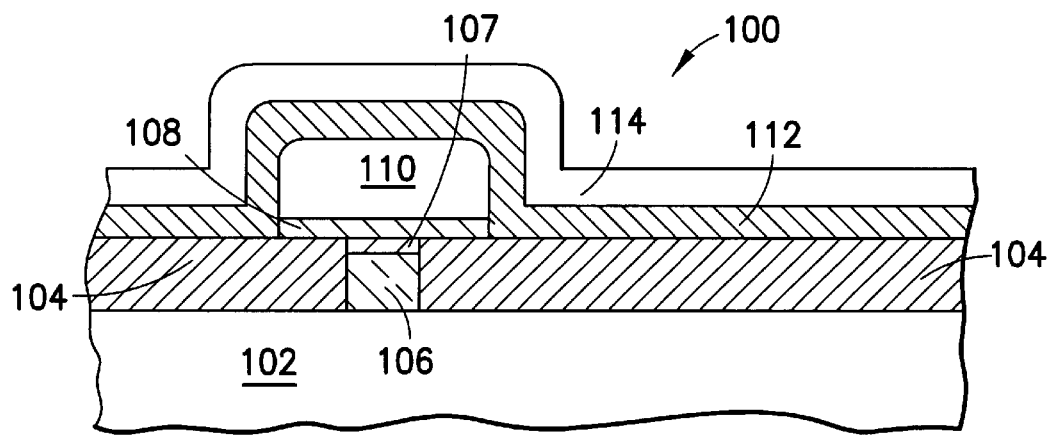
FIG. 6 shows a cross-section of the device of FIG. 5 following the deposit of a conductive layer over the high dielectric constant material.

In FIG. 6 there is shown the deposit of a layer of conductive material 114, such as platinum, which is laid on the high dielectric constant material 112. Platinum is selected from a group of conductive materials additionally including aluminum, aluminum alloys, tungsten, tungsten alloys, palladium, palladium alloys, rheuthenium, rheuthenium alloys, iridium, iridium alloys, rhenium, rhenium alloys, rhodium, rhodium alloys, gold, gold alloys, silver, silver alloys, copper, copper alloys, conductive metal compounds, conductive perovskite-like materials, reactive metals, doped silicon, and doped germanium. This layer of platinum, approximately 50 nm thick, is DC sputtered in an atmosphere of argon at 5 Torr using a platinum target with the substrate at a temperature of 325° C. Other possible methods of deposition include e-beam evaporation, chemical vapor deposition, or metalorganic CVD. The temperature range may include temperatures between 300° C. and 600° C. without significant oxidation and either platinum or aluminum diffusion occurring.

Figure 7:
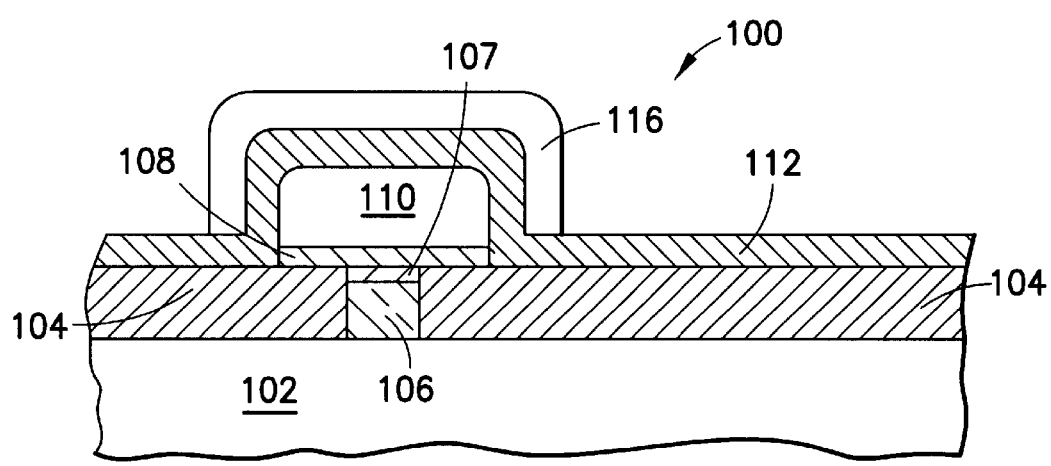
FIG. 7 is a cross-section of the device of FIG. 6 following patterning and etching of the conductive layer to form a top electrode of the capacitor.

Referring now to FIG. 7, there is shown the device 100 after the device is patterned with photoresist and etched to form the second, or upper, electrode 116 of the storage capacitor from the layer of platinum. The conductive platinum layer 114 of FIG. 6 is dry etched in a low pressure, high density plasma reactive ion etch reactor. The result is the formation of the capacitor upper electrode 116 laying on the high dielectric constant material 112 over the lower electrode 110. This combination of three layers forms the storage capacitor of an individual memory storage cell.

Figure 8:
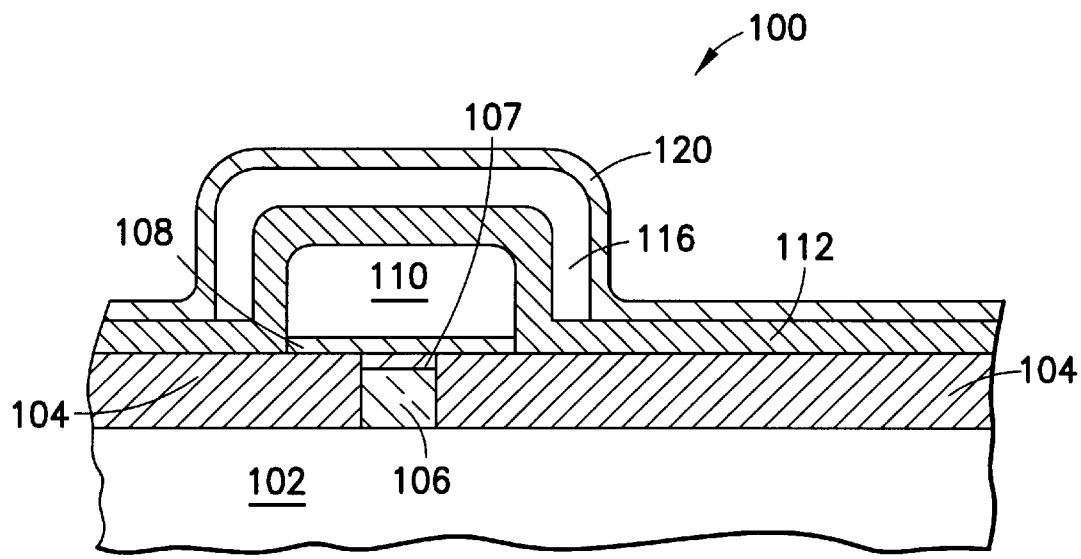
FIG. 8 shows a cross-section of the device of FIG. 7 after a layer of diffusion barrier material is deposited.

FIG. 8 shows the result of the next step of the fabrication process. Another layer of diffusion barrier material 120 is deposited over the top of the upper electrode 116 of the storage capacitor. Again titanium aluminum nitride (TiAlN) is an advantageous material for this second diffusion barrier layer 120. Approximately 100 nm of titanium aluminum nitride is deposited by reactive RF sputtering, as described previously in reference to FIG. 2.

This diffusion barrier layer 120 also substantially reduces the possibility of diffusion of oxygen during subsequent processing steps, even at temperatures in excess of 500° C. Other materials that can be used for this upper diffusion barrier layer 120 include other exotic conductive nitrides, such as Zr—N, Hf—N, Y—N, Sc—N, La—N, other rare earth nitrides, N-deficient Al nitride, doped Al nitride, Mg—N, Ca—N, Sr—N, Ba—N, and alloys of the foregoing with Ti, Ga, Ni, Co, Ta, or W. Additional materials include amorphous nitrides, such as, Ti—Si—N, Ta—B—N, Ti—B—N, and Ta—Si—N. Further materials include noble-metal conductive alloys, such as, Pd—Si—N, Pt—Si—N, Pt—Si—O, Pd—Si—O, Pd—B—O, Pd—B—N, Pd—Al—O, Pd—Al—N, Ru—Si—O, Ru—Si—N, Ir—Si—O, Ir—Si—N, Re—Si—O, Re—Si—N, Rh—Al—O, Au—Si—N, and Ag—Si—N. All can be deposited from metalorganic precursors, in accordance with well known practice. The diffusion barrier layer 120 is conductive and desirably permits little (low levels, preferably substantially no) diffusion of oxygen, platinum, copper or aluminum to occur.

Figure 9:
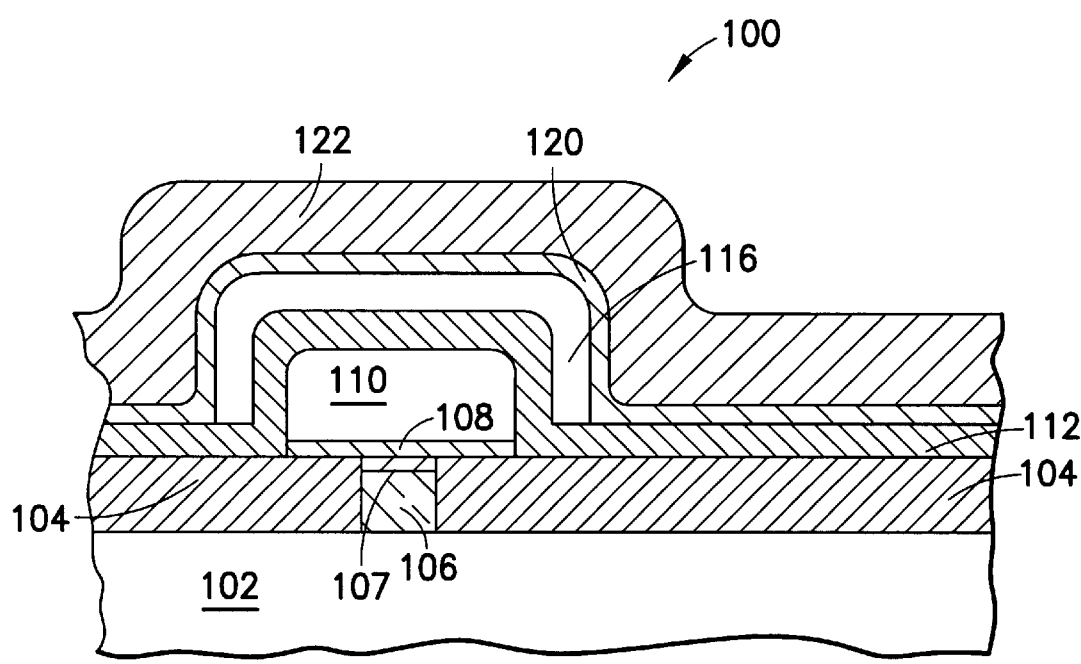
FIG. 9 is a cross-section of the device of FIG. 8 after a layer of interlevel dielectric is deposited over the diffusion barrier layer.

Referring now to FIG. 9, the next step of the process is the deposition of a layer of interlevel dielectric 122. This interlevel dielectric 122 may be silicon dioxide or silicon nitride that is deposited at a temperature in a range of 600° C. to 700° C. Because of the diffusion barrier layer 120, oxygen is prevented from oxidizing the metal of the upper electrode 116. Similarly the barrier layer 108 prevents oxidation of the plug material 106.

Figure 10:
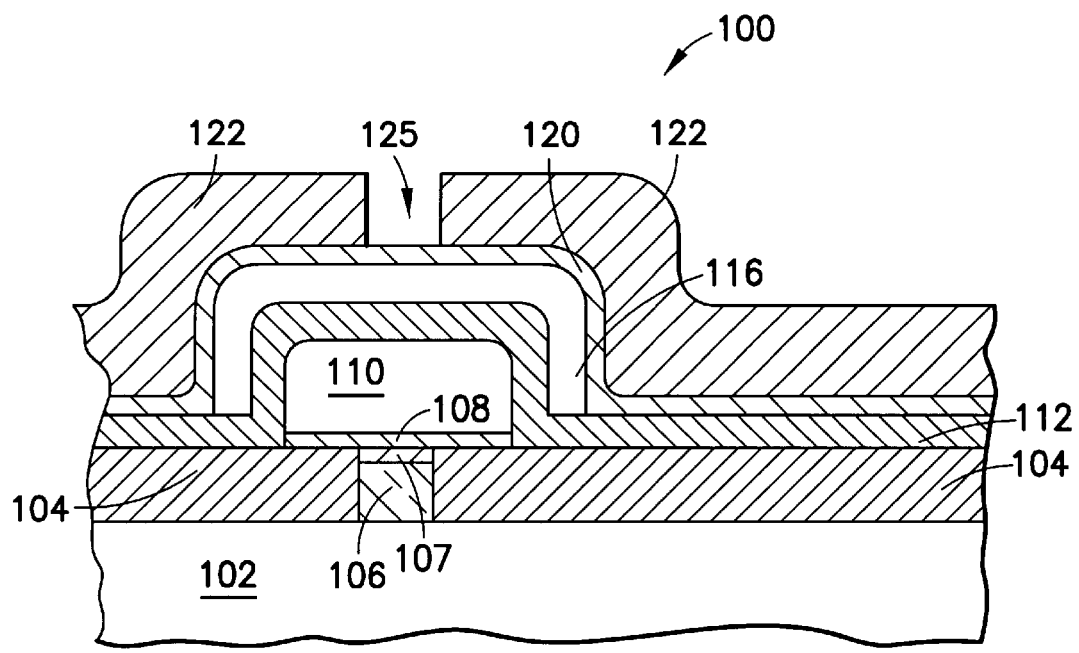
FIG. 10 is a cross-section of the device of FIG. 9 following patterning and etching the interlevel dielectric to provide a via opening to the diffusion barrier layer.

FIG. 10 shows the result after the device 100 of FIG. 9 is patterned with a photoresist and etched to form via openings, such as opening 125, through the interlevel dielectric 122 to the oxidation barrier layer 120. After the via openings are prepared, the via openings are to be filled.

Figure 11:
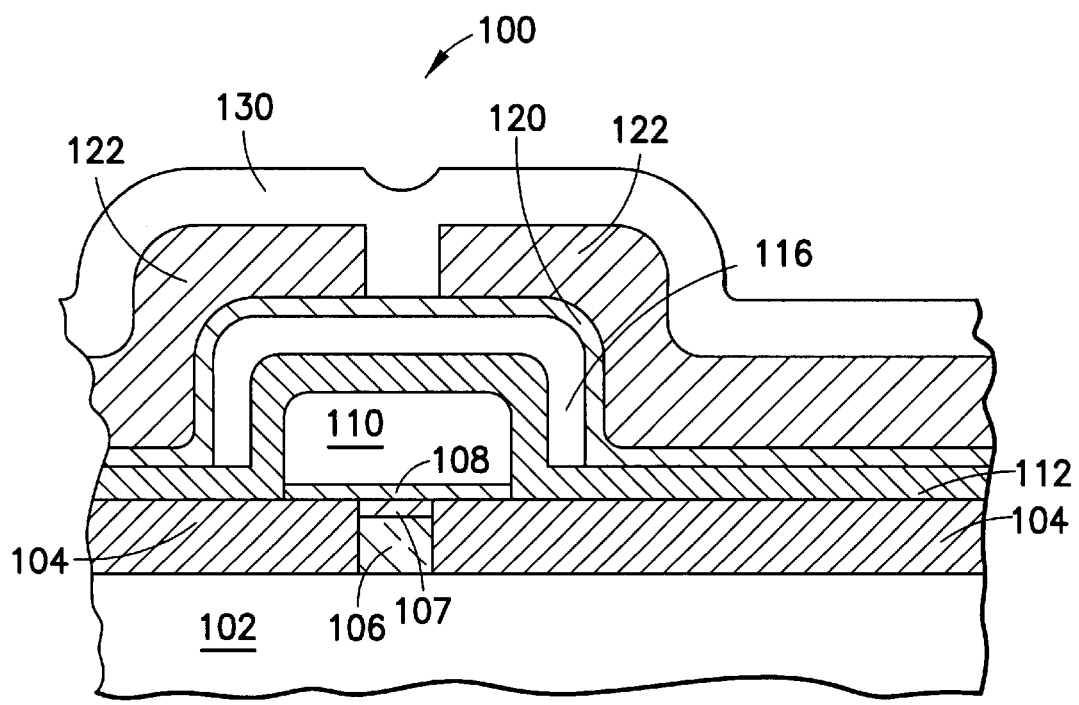
FIG. 11 is a cross-section of the device of FIG. 10 following deposition of a metal layer.

Referring now to FIG. 11, there is shown the result of depositing a layer of conductive material. The via openings may be filled and the metallization layer 130 deposited in a single deposition step. The conductive material for the metallization layer 130 is selected from metals, such as, aluminum, aluminum alloys, tungsten, tungsten alloys, copper and copper alloys. These metals are deposited by well known practice.

Figure 12:
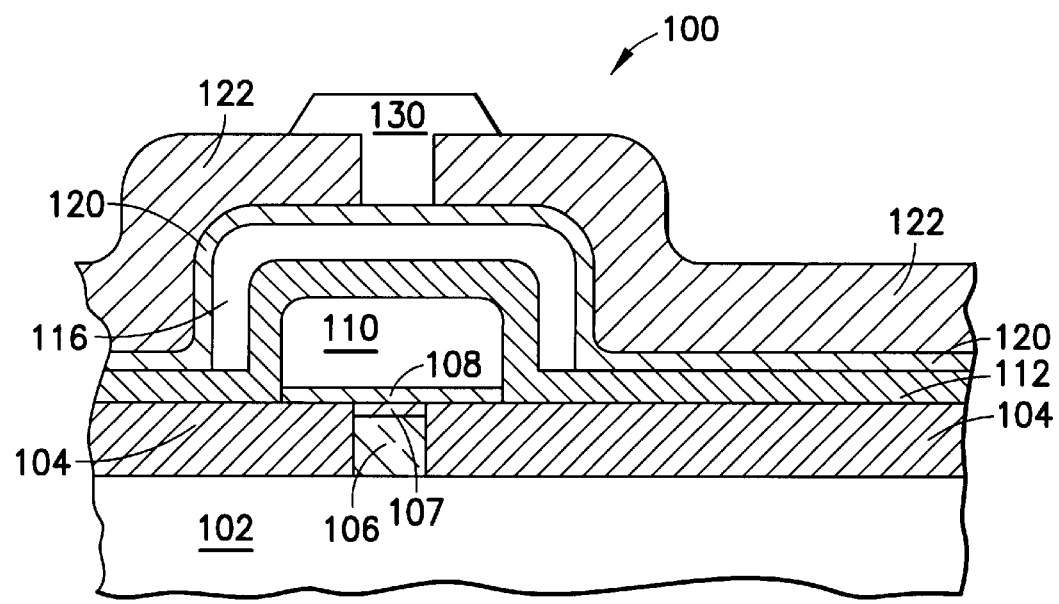
FIG. 12 is a cross-section of the device of FIG. 11 after the metal layer is patterned and etched to form a lead.

FIG. 12 shows the result after the metallization layer 130 is patterned and etched to form desired lead paths. The metallization layer 130 remains connected through the via to the diffusion barrier layer 120. Patterning is accomplished by photoresist material, as is well known. The metallization is etched away, also by well known etch processing, leaving the desired metal pattern of metallic conductive leads 130.

Figure 13:
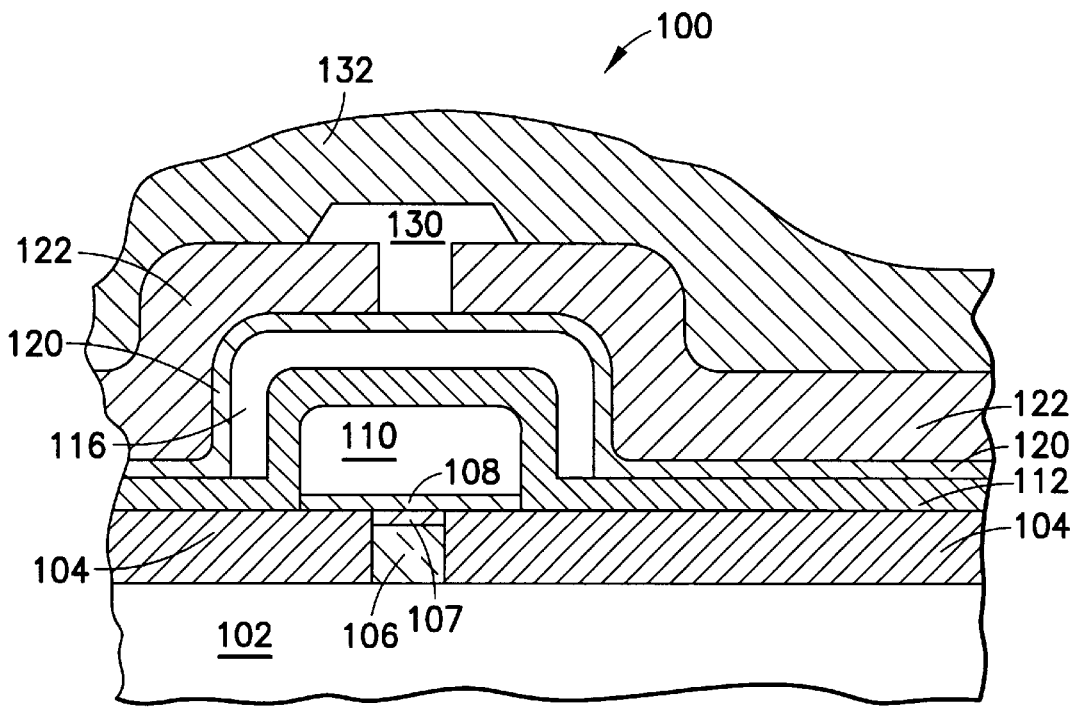
FIG. 13 is a cross-section of the device of FIG. 12 following the deposition of a layer of passivation material.

Referring now to FIG. 13, there is shown the integrated circuit device 100 following the deposit of a passivation dielectric layer 132 over the layer of metallization 130 and the interlevel dielectric layer 122. The passivation dielectric layer 132 can be a material, such as silicon dioxide or silicon nitride. Even through this passivation layer 132 is deposited at a temperature in a range from 600° C. to 700° C., the diffusion barrier layers 120 and 108 prevent substantial diffusion of oxygen, platinum, and aluminum between materials of adjacent layers on either side of the barrier layers.

As a result a storage capacitor including upper and lower electrodes 116 and 110, respectively, and the high dielectric constant insulator 112 are fully fabricated. Conductive plug material 106 is not oxidized enough to substantially reduce its conductivity. Thus conductivity remains high between the lower, or bottom, electrode 110 of the capacitor and a transfer gate transistor (not shown) in the substrate 102. Conductivity also remains high between the upper, or top, electrode 116 and the metallization layer 130.

The foregoing provides a sequence of integrated circuit processing steps representing a method for fabricating part of a storage cell using a capacitor with a high dielectric constant insulator and diffusion barriers both above the capacitor top electrode and below the capacitor bottom electrode. Other methods of fabricating such a combination can be designed. Following is another example.

Figure 14:
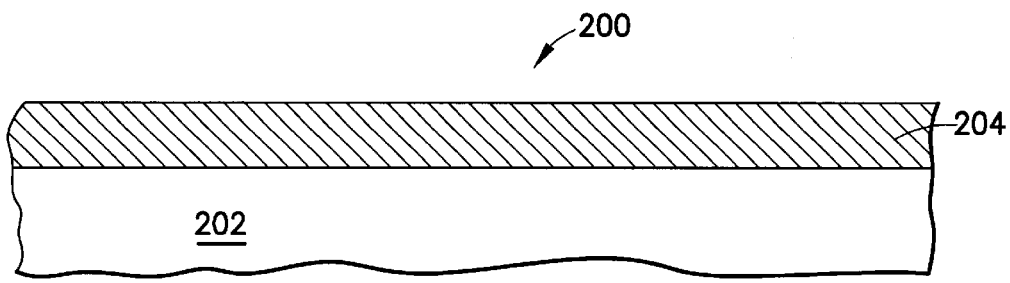
FIG. 14 is a cross-section of another semiconductor device having an insulator laid on a semiconductor substrate.

FIG. 14 shows a part of an integrated circuit storage device 200 in process. The device 200 includes a semiconductor substrate 202, which includes active device areas, not shown, and an insulator layer 204. The insulator layer 204 is deposited on the substrate 202 by a known process. The insulator layer 204 may be, for example, silicon dioxide, silicon nitride, or some combination thereof.

Figure 15:
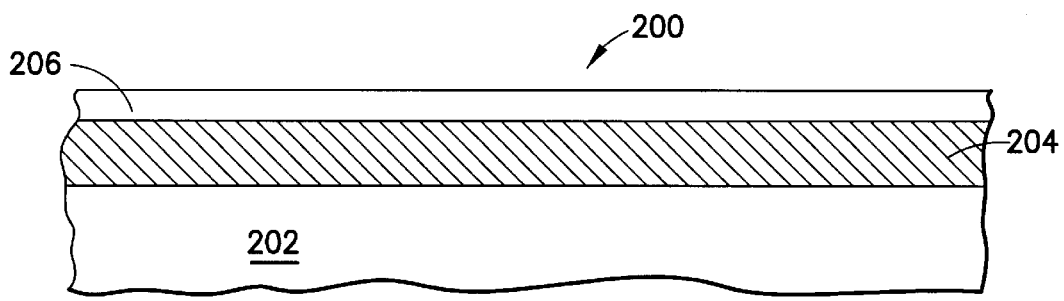
FIG. 15 shows a cross-section of the device of FIG. 14 after a conductive layer is deposited on the insulator.

Referring now to FIG. 15, there is shown the device 200 following a fabrication step wherein a layer of conductive material 206, such as platinum for example, is deposited over the insulator layer 204. The exemplary layer of platinum of some 50 nm can be DC sputtered in an atmosphere of argon at 5 Torr using a platinum target and a temperature in the range of 300° C. 600° C. As previously mentioned, other methods for depositing a layer of platinum can be used. Platinum is selected from a group of materials which are good conductors for integrated circuits. Other materials include polysilicon, doped silicon, aluminum, tungsten, and paladium. They can be deposited in accordance with well known practices.

Figure 16:
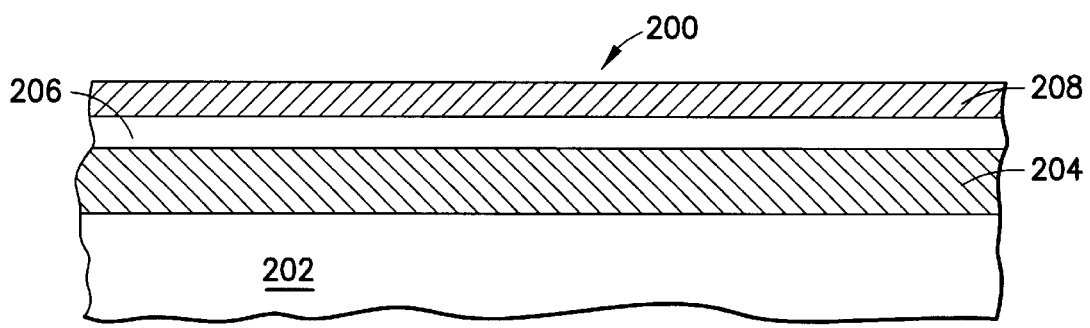
FIG. 16 is a cross-sectional view of the device of FIG. 15 following the deposition of a layer of high dielectric constant material over the conductive layer.

In FIG. 16, the next step of fabrication shows that a layer of high dielectric constant material 208, such as lead zirconium titanium oxide (PZT), strontium bismuth tantalum oxide (SBT), or barium strontium titanium oxide (BST), is deposited over the conductive layer 206. Other materials that may be used in this step are perovskites, pyroelectrics, ferroelectrics, highdielectric-constant-oxides, complex metal oxides, (Ba, Sr, Ca, Mg)(Ti, Zr)$O_3$, (Pb, La)(Zr, Ti)$O_3$, bismuth titanate, potassium tantalate, lead scandium tantalate, lead niobate, potassium niobate, lead zinc niobate, lead magnesium niobate, tantalum pentoxide, and yttrium oxide. First the device is annealed at a temperature of 600° C. for twenty-minutes in 1 Torr of oxygen. Then the high dielectric constant material is deposited by metalorganic chemical vapor deposition. This deposition occurs at a temperature of approximately 650° C. in 1 Torr of oxygen for three minutes. The layers of platinum 206 and of insulator 204 inhibit oxygen of the reactor atmosphere from diffusing through those layers into the substrate 202 and the active regions included therein, but not shown.

Figure 17:
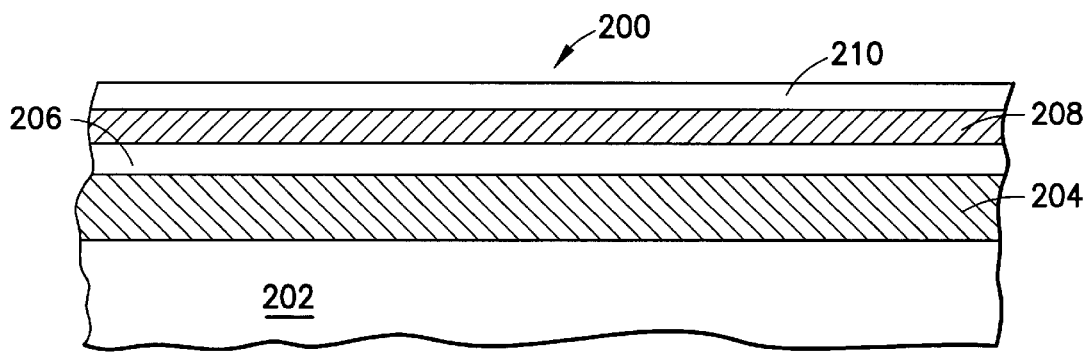
FIG. 17 shows the cross-section of the device of FIG. 16 after another layer of conductive material is deposited on the high dielectric constant material.

Referring now to FIG. 17, there is shown a second layer of conductive material 210, such as platinum, deposited over the layer of high dielectric constant material 208. Platinum is selected from a group of conductive materials also including aluminum, aluminum alloys, tungsten, and tungsten alloys. This layer also may be sputtered on to a thickness of 50 nm. The sputtering can occur in an atmosphere of argon at 5 Torr using a platinum target in a temperature range of 300° C.–600° C. The other previously mentioned methods for depositing platinum may also be used.

Figure 18:
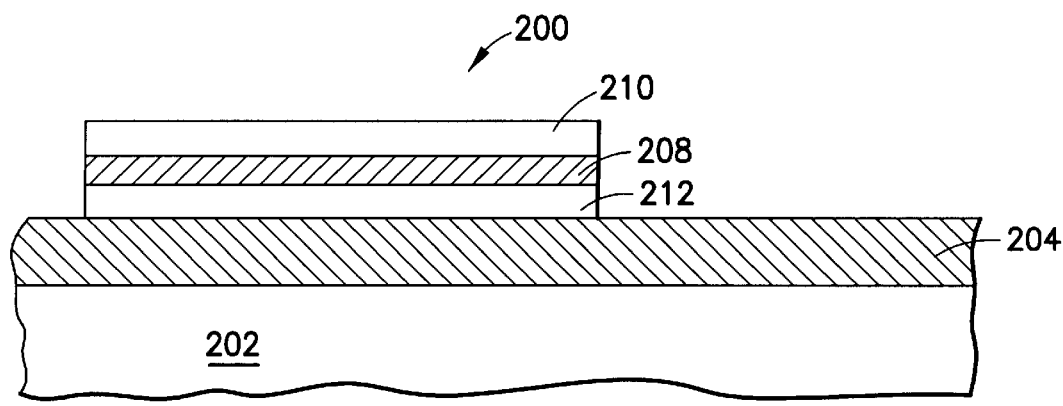
FIG. 18 is a cross-sectional view of the device of FIG. 17 after it is patterned and etched to form two conductive plates of the capacitor separated by the high dielectric constant material.

FIG. 18 shows the portion of the device 200 after the device has been patterned with photoresist and etched. Desired portions of the upper and lower layers of platinum or other conductive material and of the high dielectric constant material 208 are left to form a lower electrode 212, the high dielectric constant material 208, and the upper electrode 210. After the photoresist is removed, another layer of photoresist is applied and patterned to form the remainder of the storage capacitor.

Figure 19:
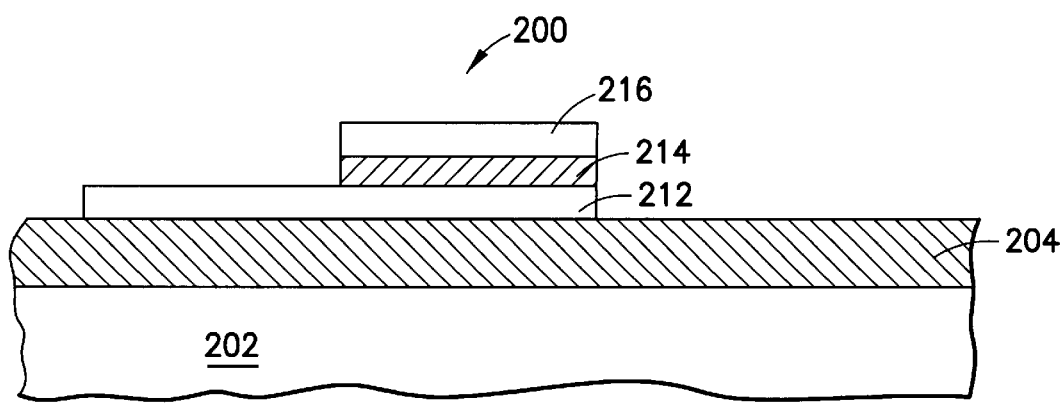
FIG. 19 shows the cross-section of the device of FIG. 18 after it is patterned and etched to provide a surface for contacting the lower conductive plate, or storage node, of the capacitor.

Referring to FIG. 19, there is shown the device 200 following the etching of the upper electrode 216, or upper layer of conductive material, shaped into the desired capacitor electrode. The etch also removes more of the high dielectric constant material 208 of FIG. 18 to leave the capacitor insulator 214.

Figure 20:
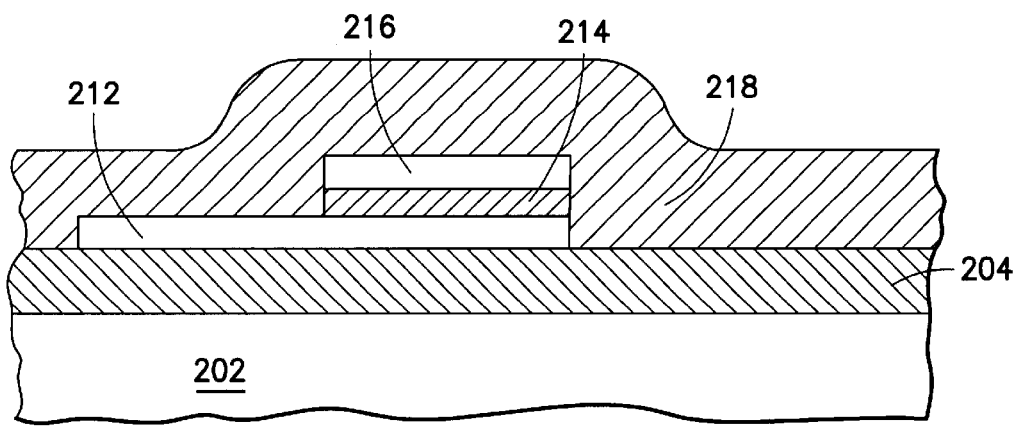
FIG. 20 is a cross-sectional view of the device of FIG. 19 after an interlevel dielectric is deposited over the top of the device.

In FIG. 20, there is shown the portion of the device 200 after a layer of interlevel dielectric 218, such as silicon dioxide or silicon nitride, is deposited overall.

Figure 21:
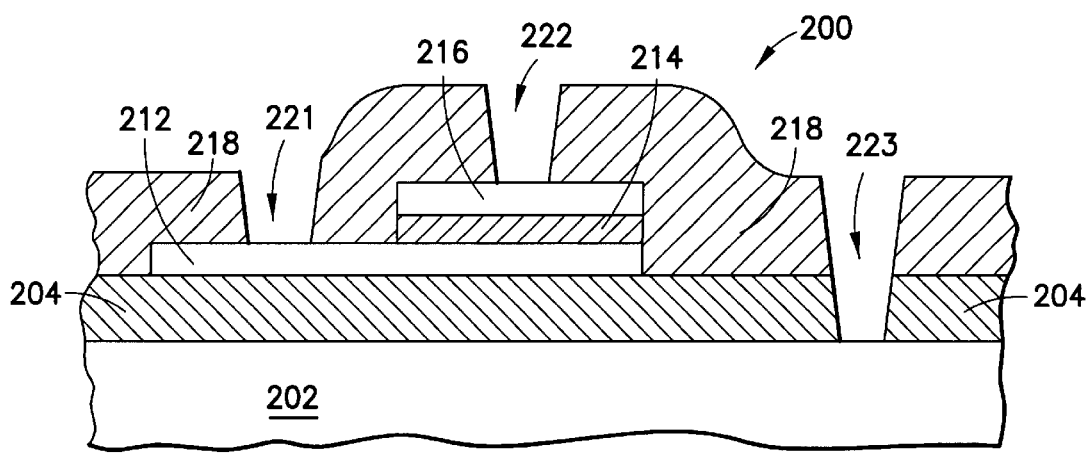
FIG. 21 shows a cross-sectional view of the device of FIG. 20 after the interlevel dielectric is patterned and etched to form openings for contact plugs.

As shown in FIG. 21, the layer of interlevel dielectric 218 is patterned with a photoresist and etched to form contact plug holes 221, 222, and 223. The insulator 218 is etched down at the contact plug hole locations 221 and 222 until the platinum or other conductor of the lower electrode 212 and the upper electrode 216, respectively, are reached. Similarly the contact plug hole 223 is etched down through the insulator, or dielectric, layers 218 and 204 until the semiconductor substrate 202 is reached. Once the contact plug openings are prepared, the device 200 is ready for deposition of a layer of oxidation barrier material.

Figure 22:
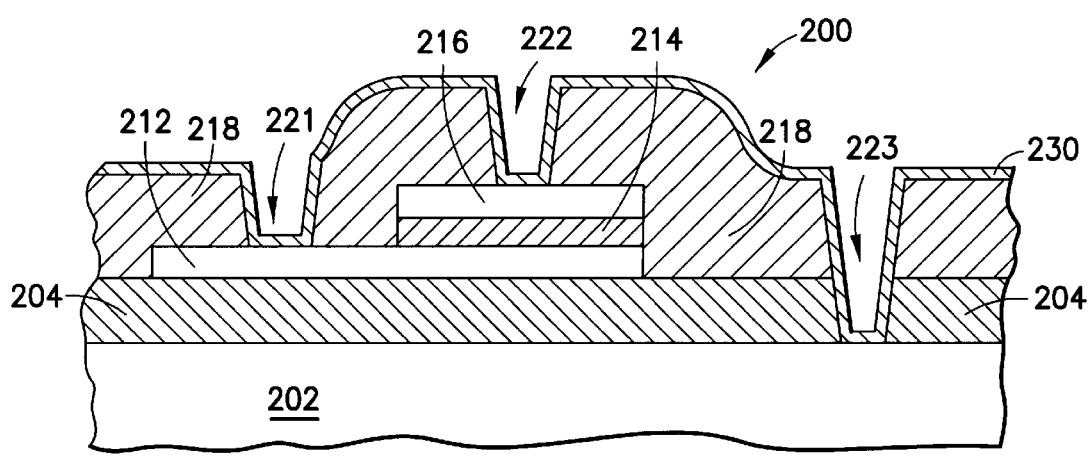
FIG. 22 is a cross-section of the device of FIG. 21 after diffusion barrier layer is laid over the top of the device.

Referring now to FIG. 22, there is shown the device 200 after a layer of diffusion barrier material 230 is deposited overall including down into the contact plug openings 221, 222, and 223. Titanium aluminum nitride (TiAlN) is an advantageous material for this diffusion barrier layer 230. Approximately 100 nm of titanium aluminum nitride is deposited by reactive RF sputtering, as described previously herein.

This barrier layer will substantially reduce the possibility of diffusion of oxygen during subsequent processing steps that require high temperatures in excess of 500° C. Other materials that can be used for the diffusion barrier layer 230 include other exotic conductive nitrides, such as, Zr—N, Hf—N, Y—N, Sc—N, La—N, other rare earth nitrides, N-deficient Al nitride, doped Al nitride, Mg—N, Ca—N, Sr—N, Ba—N, and alloys of the foregoing with Ti, Ga, Ni, Co, Ta, or W. Additional materials include amorphous nitrides, such as, Ti—Si—N, Ta—B—N, Ti—B—N, and Ta—Si—N. Further materials include noble-metal conductive alloys, such as Pd—Si—N, Pt—Si—N, Pt—Si—O, Pd—Si—O, Pd—B—O, Pd—B—N, Pd—Al—O, Pd—Al—N, Ru—Si—O, Ru—Si—N, Ir—Si—O, Ir—Si—N, Re—Si—O, Re—Si—N, Rh—Al—O, Au—Si—N, and Ag—Si—N. All can be deposited from metalorganic precursors, in accordance with known practice. The barrier layer is a conductive diffusion barrier layer.

Figure 23:
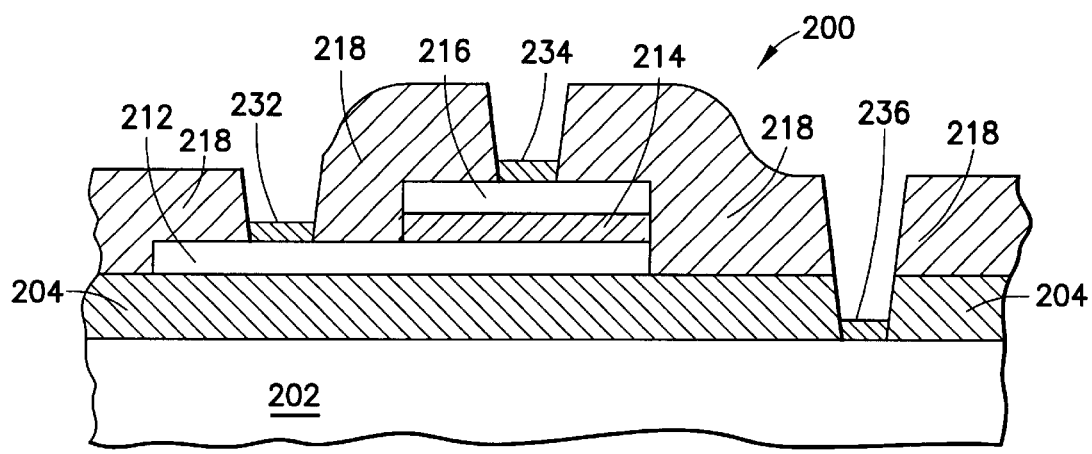
FIG. 23 shows a cross-section of the device of FIG. 22 after patterning and etching of the diffusion barrier layer to limit the diffusion barrier material to providing coverage of the conductors and the semiconductor substrate at the bottom of the contact plug openings.

FIG. 23 shows the semiconductor device 200 following an overall etch of the diffusion barrier layer leaving a portion of the original diffusion barrier layer 230 of FIG. 22 at the bottom of each of the contact plug openings. Thus a diffusion barrier layer 232 makes contact with the lower capacitor electrode 212. Diffusion barrier layer 234 makes contact with the upper capacitor electrode 216, and diffusion barrier layer 236 makes contact with the surface of the semiconductor substrate 202. A transfer transistor of the memory cell may be located below the diffusion barrier layer 236, but it is not shown. These diffusion barrier layers 232, 234, and 236 are conductive and they prevent diffusion therethrough during subsequent processing steps even at high temperatures, for example above 500° C.

Figure 24:
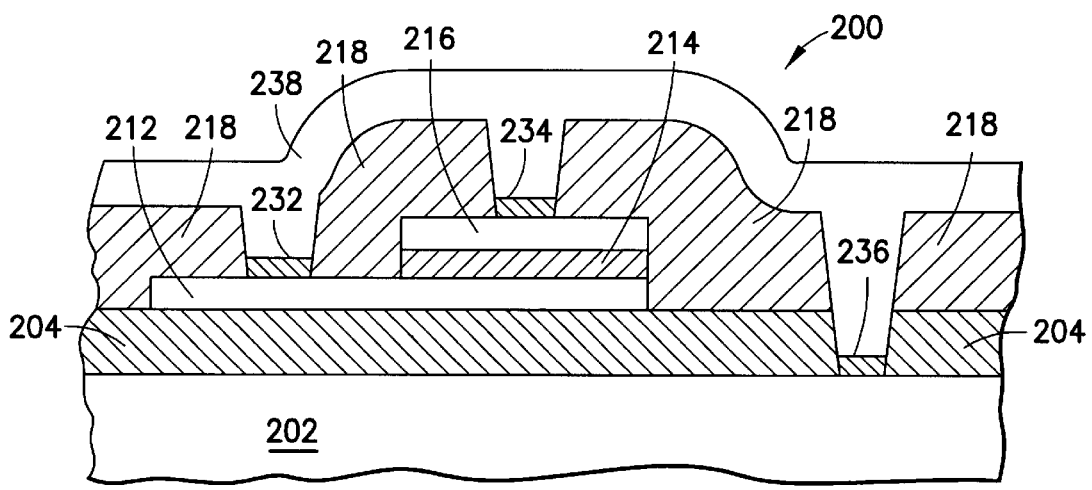
FIG. 24 is a cross-section of the device of FIG. 23 following the deposit of a metallization layer over the top of the device.

In FIG. 24 there is shown the semiconductor device 200 after a layer of conductive material, or metallization, 238 is deposited over the interlevel dielectric 218 and the diffusion barrier layers 232, 234, and 236. The conductive material 238 makes contact with the diffusion barrier layers 232, 234, and 236. The conductive material 238 may be selected from a group of conductive materials, such as, platinum, aluminum, aluminum alloys, tungsten, and tungsten alloys. This layer is sputtered on to a thickness of 50 nm. The sputtering can occur in an atmosphere of argon at 5 Torr using a temperature range of 300° C.–600° C. Other known methods of deposit can be used. The diffusion barrier layers 232, 234, and 236 significantly reduce the possibility of any diffusion of the layer of conductive material 238 to the capacitor electrodes 212 and 216 or the semiconductor substrate 202.

Figure 25:
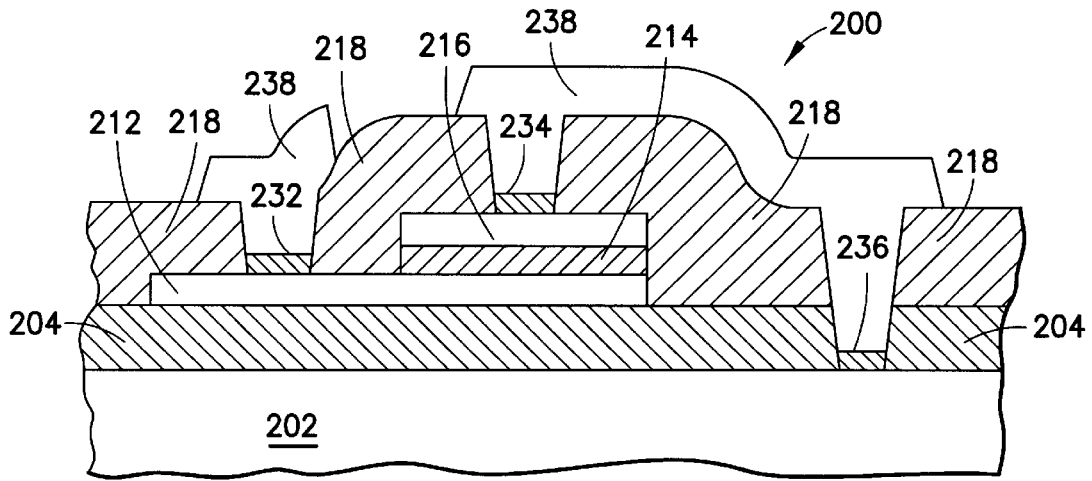
FIG. 25 is a cross-section of the device of FIG. 24 after the metallization layer is patterned and etched into circuit leads, such as wordlines and bitlines.

Referring now to FIG. 25, there is shown the semiconductor device 200 after the layer of conductive material 238 is patterned and etched to form desired lead lines in the layer of conductive material. The pattern is formed of photoresist material. Etching is accomplished in accordance with well established practice.

Figure 26:
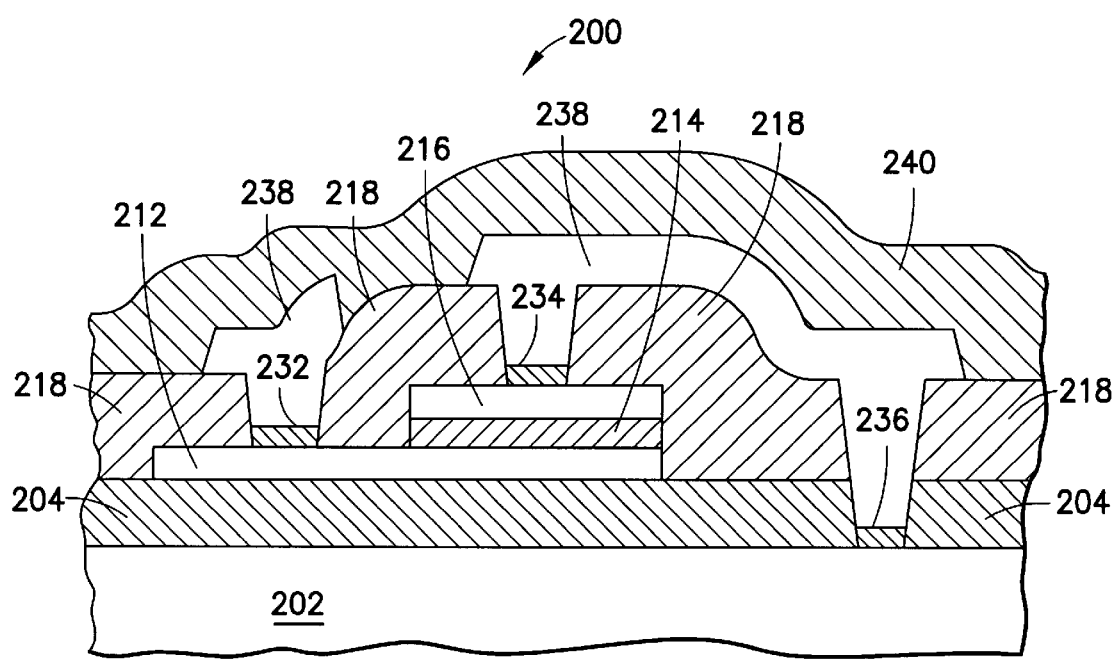
FIG. 26 is a cross-section of the device of FIG. 25 following the deposit of a passivation layer over the device.

FIG. 26 shows the semiconductor device of FIG. 25 after a layer of passivation dielectric 240 is deposited over the conductive material layer 238 and the interlevel dielectric layer 218. The passivation dielectric may be a material, such as silicon dioxide, silicon nitride, or other insulator that can provide mechanical and electrical protection for the top surface of the semiconductor device 200. Material of the passivation dielectric layer 240 is deposited by well known techniques.

Figure 27:
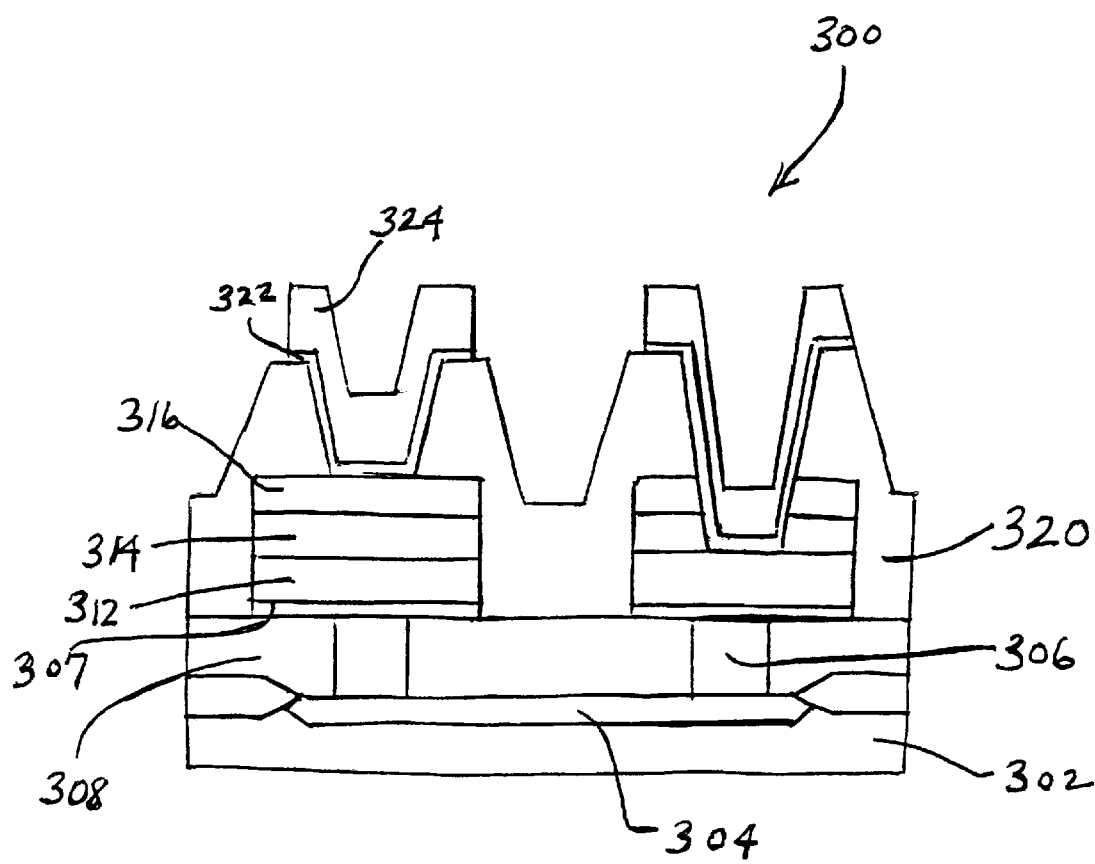
FIG. 27 is a cross-section of a ferroelectric random access memory structure, in accordance with one embodiment of the invention.

FIG. 27 is a cross-sectional elevation view of a ferroelectric random access memory (FERAM) device utilizing a diffusion barrier layer structure in accordance with the present invention.

As shown in FIG. 27, the FERAM device 300 comprises a p-type silicon base layer 302 having an n+layer 304 thereon. A contact plug 306 of polysilicon or other conductive material is fabricated in a layer 308 of insulator material such as $SiO_2$. The opening through insulator layer 308 containing plug 306 is fabricated by conventional patterned photoresist and etching steps.

A conductive diffusion barrier layer 107 is formed over the plug 106 and surrounding layer 104 of insulative material, as shown. The barrier layer may be formed of titanium silicide or other suitable material.

Overlying the conductive diffusion barrier is a ferroelectric capacitor structure including a bottom electrode layer 312, an intermediate ferroelectric material layer 314 and a top electrode layer 316.

The ferroelectric capacitor structures is overlaid with a dielectric material layer 320, which may be formed of $SiO_2$.

Overlying the dielectric material layer 320 is a conductive diffusion barrier layer 322, which in turn is overlaid as shown with a metallization layer 324. The metallization layer 324 may be formed of aluminum or other suitable metal. Such metallization layer may be patterned and etched to form desired lead lines, using conventional photoresist and etching techniques.

Other FERAM device structures in which the diffusion barrier layer architecture of the present invention may be usefully employed are disclosed in "Ferroelectric Non-Volatile Memory Technology: Application and Integration Challenges," Zurcher, Peter, et al., paper presented at IEEE 1996 Meeting, June, 1996, NVNTC, Albuquerque, New Mexico, the disclosure of which hereby is incorporated herein by reference.

The invention has been described herein with reference to specific features, aspects and embodiments. It will be appreciated that the applicability of the invention is not thus limited, but readily extends to and encompasses numerous variations, modifications and other embodiments as will readily suggest themselves to those of ordinary skill in the art. Accordingly, the invention is to be broadly construed, consistent with the claims hereafter set forth.

What is claimed is:

1. A semiconductor device comprising:
   a semiconductor substrate;
   a conductive plug formed over the substrate;
   a buffet layer formed on the plug;
   a first diffusion barrier layer covering the entire buffer layer;
   a first capacitor electrode laid over the first diffusion barrier layer, wherein the diffusion barrier layer isolates the electrode from underlying layers;
   a layer of high dielectric constant material laid over the first capacitor electrode;
   a second capacitor electrode laid over the high dielectric constant material;
   a second diffusion barrier layer laid over the second capacitor electrode; and
   a conductor connecting with the second diffusion barrier layer, wherein the first and second diffusion barrier layers are conductive and independently comprise materials selected from the group consisting of:
(a) amorphous nitrides selected from the group consisting of: TiSiN, TaBN, IiBN, and TaSiN,
(b) exotic conductive nitrides selected from the group consisting of: TiAlN, Hfn, YN, ScN, LaN, rare earth nitrides, N-deficient AlN, doped AlN, MgN, CaN, SrN, BaN, and alloys thereof with an alloying component selected from the group consisting of Ti, Ga, Ni, Co, Ta and W, and
(c) noble-metal-insulator-alloys selected from the group consisting of PdSiN, PtSiN, PtSiO, PdSiO, PdBO, PdBN, PdAlO, PdAlN, RuSiO, RuSiN, IrSiO, IrSiN, ReSiO, ReSiN, RhAlO, AuSiN and AgSiN.

2. A semiconductor device, in accordance with claim 1, wherein:
the conductor is a metal.

3. A semiconductor device, in accordance with claim 1, wherein:
the conductor is a material selected from a group of materials including aluminum, aluminum alloys, tungsten, tungsten alloys, copper and copper alloys.

4. A semiconductor device, in accordance with claim 11, wherein:
the first and second diffusion barrier layers independently comprise materials selected from the group consisting of TiSiN, TiAlN and PdSiN.

5. A semiconductor device, in accordance with claim 11, wherein:
the first and second diffusion barrier layers each comprise TiAlN.

6. A semiconductor device, in accordance with claim 1, wherein:
the first and second capacitor electrodes are metallic materials.

7. A semiconductor device, in accordance with claim 1, wherein:
the first and second capacitor electrodes are metallic materials selected from a group of materials including aluminum group metals, tungsten group metals, platinum group metals, palladium group metals, ruthenium group metals, iridium group metals, rhenium group metals, rhodium group metals, gold group metals, silver group metals, copper group metals, conductive metal compounds, conductive perovskite like materials, reactive metals, doped silicon, and doped germanium.

8. A semiconductor device, in accordance with claim 1, wherein:
the high dielectric constant material is a perovskite material.

9. A semiconductor device, in accordance with claim 8, wherein:
the high dielectric constant material is a complex metal oxide.

10. A semiconductor device, in accordance with claim 1, wherein:
the high dielectric constant material is selected from a group of materials including perovskites, pyroelectrics, ferroelectrics, high-dielectric-constant-oxides, (Ba, Sr, Ca, Mg) $(Ti,Zr)o_3$, $(Pb,La)(Zr,Ti)o_3$, $SrBi_2Ta_2O_9$ bismuth titanate, potassium tantalate, lead scandium tantalate, lead niobate, potassium niobate, lead zinc niobate, lead magnesium niobate, tantalum pentoxide, and yttrium oxide.

11. A semiconductor device, in accordance with claim 1, wherein:
the conductive plug is a material selected from a group of materials including polysilicon, doped silicon, aluminum, aluminum alloys, tungsten, tungsten alloys, copper and copper alloys.

12. A semiconductor device, in accordance with claim 1, wherein:
the buffer layer is titanium silicide.

13. A semiconductor device, in accordance with claim 1, further comprising:
an interlevel dielectric layer deposited over the diffusion barrier layer.

* * * * *